United States Patent

Ichikawa

[11] Patent Number: 5,823,419
[45] Date of Patent: Oct. 20, 1998

[54] BONDING TOOL

[75] Inventor: Shigeru Ichikawa, Higashiyamato, Japan

[73] Assignee: Kabushiki Kaisha Shinkawa, Tokyo, Japan

[21] Appl. No.: 715,188

[22] Filed: Sep. 17, 1996

[30] Foreign Application Priority Data

Sep. 18, 1995 [JP] Japan .................................... 7-263491

[51] Int. Cl.$^6$ ................................ B23K 3/00; H01L 21/60
[52] U.S. Cl. .......................... 228/55; 228/44.7; 403/381; 81/438
[58] Field of Search ................................ 228/6.2, 55, 51, 228/1.1, 44.7; 403/381; 81/438, 25; 241/300, 294

[56] References Cited

U.S. PATENT DOCUMENTS

| | | | |
|---|---|---|---|
| 1,881,698 | 10/1932 | Kuriyama | 228/55 |
| 2,332,384 | 10/1943 | Koster | 81/25 |
| 4,924,576 | 5/1990 | Schiller | 81/25 |
| 5,205,460 | 4/1993 | Sato et al. | 228/51 |

FOREIGN PATENT DOCUMENTS

| | | | |
|---|---|---|---|
| 5-259219 | 10/1993 | Japan | H01L 21/60 |
| 6-216198 | 8/1994 | Japan | H01L 21/60 |

*Primary Examiner*—Samuel M. Heinrich
*Attorney, Agent, or Firm*—Koda & Androlia

[57] ABSTRACT

A bonding tool used in a bonding apparatus for bonding, for example, pellet and leads of a lead frame including a tool attachment part to which a tool member is mounted. The tool member has four inclined surfaces, and the tool attachment part includes two fixed guide members and two detachable guide members fastened to the tool attachment part by bolts. Inclined surfaces that position two adjacent inclined surfaces of the tool member are formed on the fixed guide members, and inclined surfaces that position the other two inclined surfaces of the tool member are formed on the detachable guide members. The tool member is mounted on and dismounted from the tool attachment part by merely removing the detachable guide members.

2 Claims, 2 Drawing Sheets

BONDING TOOL

BACKGROUND OF THE INVENTION

1. Field of the Invention

The present invention relates to a bonding tool used in a bonding apparatus which bonds semiconductor pellets to the leads of lead frames or leads installed on film carriers.

2. Prior Art

One example of a bonding apparatus which is used to bond semiconductor pellets to leads installed on a film carrier is disclosed in Japanese Patent Application Laid-Open (Kokai) No. 5-259219. In this bonding apparatus, the bonding tool is attached to a tool holder which is driven in the horizontal (X and Y) direction and in the vertical (Z) direction. Accordingly, when bonding is accomplished, the leads of the film carrier are positioned above the semiconductor pellet, and then the bonding tool is lowered from above the leads so that the bonding tool press-bonds the leads to bumps located on the semiconductor pellet.

Generally, such a bonding tool is comprised of a tool part and a shank part which is attached to the tool holder of the bonding apparatus, and the tool part and the shank part are formed as an integral body. Accordingly, in cases where the shape of the tool part varies according to the type of product to be bonded, it is necessary to prepare a relatively large bonding tool which has both a shank part and a suitable tool part for each type of product to be bonded. As a result, a large space is required for the storage of the bonding tools, and the cost of the bonding tools is increased.

Conventional devices which solve the problems above include, for example, a device disclosed in Japanese Patent Application Laid-Open (Kokai) No. 6-216198. In this device, the shank part and tool part are formed as separate members, and the tool member is detachably mounted to the shank member. More specifically, a projecting part is formed on the undersurface of a heating part which is an integral part of the shank member, and a recessed part which engages with the projecting part is formed in the upper surface of the tool member. The recessed part formed in the tool member is brought to engage with the projecting part formed on the shank member, and the shank member and tool member are fastened together by nuts and bolts.

In the prior art described above, the recessed part formed in the tool member is engaged with the projecting part formed on the shank member. Accordingly, in cases where, for instance, the tool member is removed from the shank member for cleaning and then again attached to the shank member following cleaning, the attachment of the tool member cannot be done easily as a result of the presence of a gap that is between the projecting part and recessed part. In addition, time is required for the attachment and adjustment of the tool member. Furthermore, the projecting part and recessed part need to be shaped so as to be engaged together, and the shaping and forming of such members is difficult and expensive. Moreover, depending on the type of product to be bonded, there may be instances in which the shape of the tool member is the same but the orientation of the tool member is simply rotated by 90 degrees. However, even in such cases, a separate bonding tool must be prepared for each product type.

SUMMARY OF THE INVENTION

Accordingly, the first object of the present invention is to provide a bonding tool in which the attachment of the bonding member can be easily done, the tool member attachment and adjustment time can be short, and a reduction in cost is accomplished.

The second object of the present invention is to provide a bonding tool which requires a small number of different tool types.

The above objects are accomplished by a unique structure of the present invention for a bonding tool in which a tool member is detachably mounted to the lower end of the tool attachment part of a shank member, and the unique structure of the present invention is that the side surfaces of the tool holding part of the tool member are formed as four-sided inclined surfaces, two fixed guide members, on which inclined surfaces that position two adjacent inclined surfaces of the tool member are formed, are provided on the tool attachment part of the shank member, and two detachable guide members, on which inclined surfaces that can push against the remaining two inclined surfaces of the tool member so that the tool member is pushed against the fixed guide members are formed, are provided on the tool attachment part of the shank member.

BRIEF DESCRIPTION OF THE INVENTION

FIG. 1 (a) is the front view thereof, and FIG. 1 (b) is the bottom view thereof;

FIG. 2 (a) is the front view thereof, and FIG. 2 (b) is the bottom view thereof;

FIG. 3 (a) is a front view thereof, and FIG. 3 (b) is a bottom view thereof;

FIG. 4 (a) is the front view thereof, and FIG. 4 (b) is the bottom view thereof;

FIG. 5 (a) is the front view thereof, and FIG. 5 (b) is the side view thereof; FIG. 6 (a) is the front view thereof, and FIG. 6 (b) is the bottom view thereof.

DETAILED DESCRIPTION OF THE PREFERRED EMBODIMENTS

One embodiment of the present invention will be described with reference to FIGS. 1 through 6.

Figure 1:
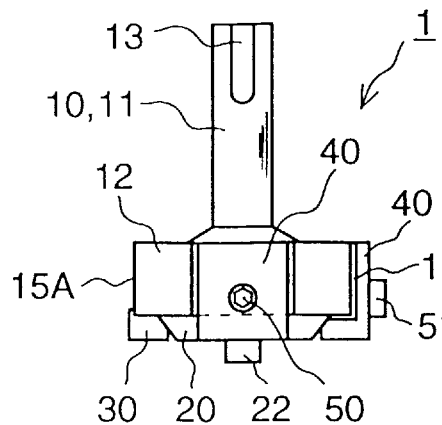
FIG. 1 illustrates one of preferred embodiments of the bonding tool of the present invention.
Figure 1:
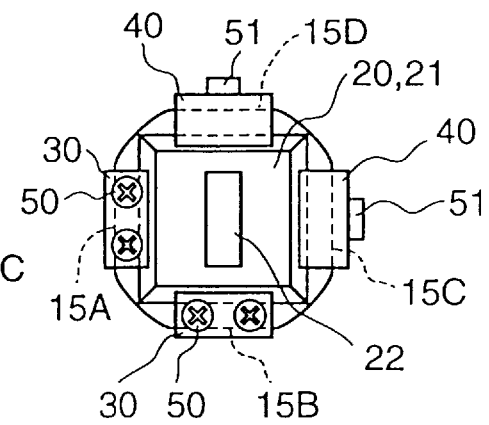

As shown in FIG. 1, the bonding tool 1 is comprised of a shank member 10, a tool member 20 mounted on the shank member 10, two fixed guide members 30, two detachable guide members 40, and bolts 50 and 51 which fasten the fixed guide member 30 and detachable guide member 40 to the shank member 10.

Figure 2:
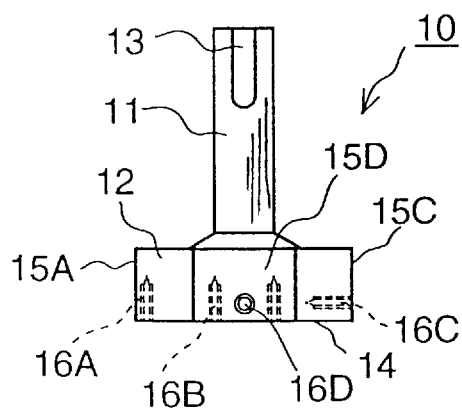
FIG. 2 illustrates the shank member of the bonding tool.
Figure 2:
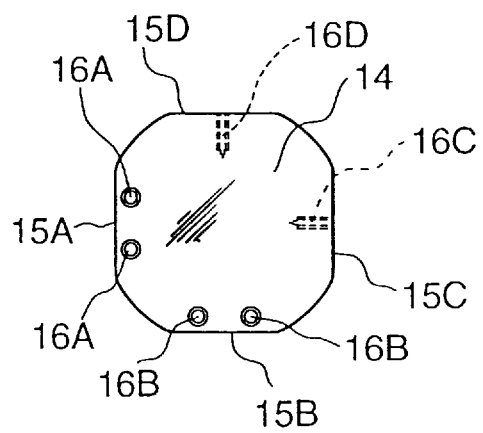

In the shank member 10, as shown in FIG. 2, a tool attachment part 12 is formed on the lower end of a shank part 11 which is attached to a tool holder (not shown) that is driven in the vertical (Z) direction and in the horizontal (X and Y) directions, and U-shaped groove 13 used for positioning and insertion of the tool holder is formed in the shank part 11.

The undersurface 14 of the tool attachment part 12 is formed as a flat surface having substantially a square shape as best seen in FIG. 2(b), and the side surfaces 15A, 15B, 15C and 15D of the tool attachment part 12 are formed as regular squares. Screw apertures 16A and 16B with which respective fixing bolts 50 are screw-engaged are formed in portions of the undersurface 14 that correspond to two adjacent side surface 15A and 15B, and screw apertures 16C and 16D with which respective attachment bolts 51 are screw-engaged are formed in the remaining two adjacent side surface 15C and 15D.

Figure 3:
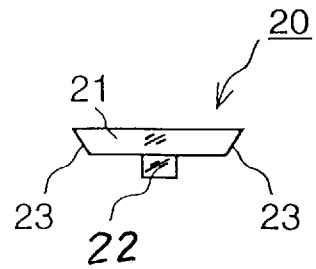
FIG. 3 illustrates the tool member of the bonding tool.
Figure 3:
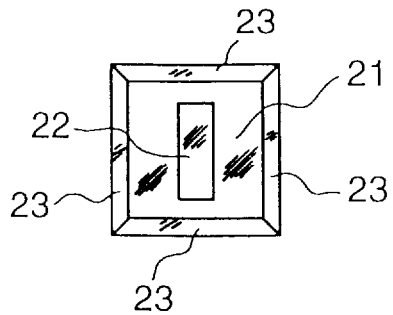

The tool member 20 has, as shown in FIG. 3, a pressing contact section 22 on the undersurface of a tool holding section 21. The upper surface of the tool holding section 21 is a flat surface, and four inclined surfaces 23 which incline inward toward the undersurface are formed as a rectangular shape on the side surfaces of the tool holding section 21.

Figure 4:
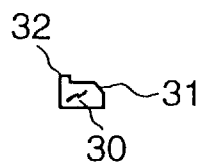
FIG. 4 illustrates the fixed guide members of the bonding tool.
Figure 4:
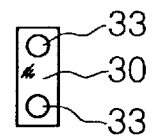
Figure 5:
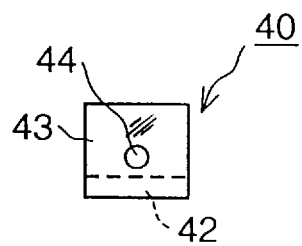
FIG. 5 illustrates the detachable guide members of the bonding tool.
Figure 5:
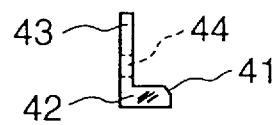
Figure 6:
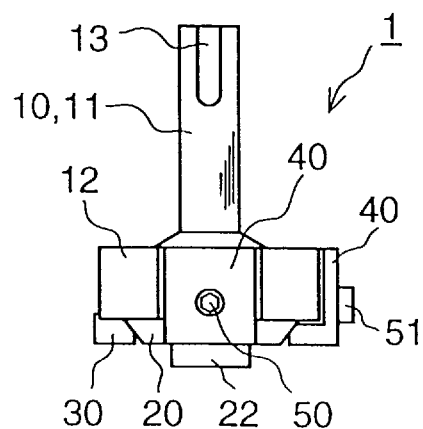
FIG. 6 shows the tool member of FIG. 1 rotated by 90 degrees.
Figure 6:
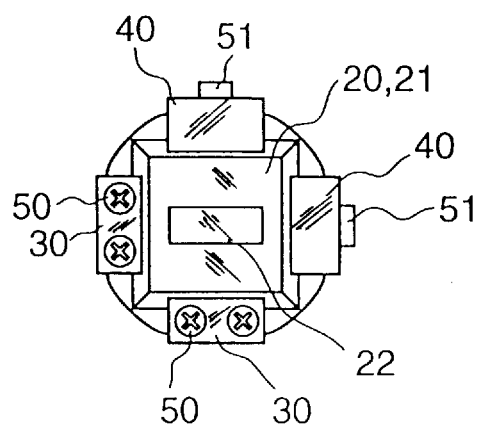

In each of the fixed guide members 30, as shown in FIG. 4, an inclined surface 31 with the same inclination as the inclined surfaces 23 of the tool member 20 shown in FIG. 3 is formed on one side, while a positioning edge 32 which projects upward is formed on the other side. Furthermore, bolt holes 33 into which the fixing bolts 50 are inserted are formed in positions that correspond to the screw apertures 16A and 16B of the tool attachment part 12 of the shank member 10 shown in FIG. 2.

As shown in FIG. 5(b), each of the detachable guide members 40 is L-shaped and has a tool member pressing section 42 which has an inclined surface 41 that has the same inclination as the inclined surfaces 23 of the tool member 20 shown in FIG. 3(a). Furthermore, a bolt hole 44 into which one of the attachment bolts 51 is inserted is formed in the rising section 43 behind the tool member pressing section 42 in a position that corresponds to one of the screw apertures 16C or 16D of the tool attachment part 12 shown in FIG. 2(b).

The assembly of the bonding tool 1 will be described with reference to FIGS. 1 through 5.

First, the positioning edges 32 of the fixed guide members 30 are brought to contact the side surfaces 15A and 15B of the tool attachment part 12 so that the bolt holes 33 of the fixed guide members 30 are aligned with the screw apertures 16A and 16B formed in the undersurface 14 of the tool attachment part 12.

The fixed guide members 30 are then fastened to the tool attachment part 12 by the fixing bolts 50.

Next, the bolt hole 44 of one of the detachable guide members 40 is aligned with the screw aperture formed in one of the side surfaces 15C or 15D of the tool attachment part 12 so that, in the disclosed embodiment, the screw aperture 16C formed in the side surface 15C and one of the attachment bolts 51 is loosely screwed into the screw aperture 16C.

Next, the tool member 20 is inserted from the side surface 15D along the undersurface 14 of the tool attachment part 12 so that the tool member 20 is positioned between the two fixed guide members 30 and one detachable guide member 40.

Finally, the bolt hole 44 of the other detachable guide member 40 is aligned with the screw aperture 16D of the side surface 15D of the tool attachment part 12, and the detachable guide member 40 is fastened to the tool attachment part 12 by means of the attachment bolt 51. The attachment bolt 51 on the side surface 15C is then tightened so that the first detachable guide member 40 is positionally secured to the tool attachment part 12.

As a result, two of the inclined surfaces 23 of the tool member 20 are pressed by the inclined surfaces 41 of the two detachable guide members 40, while the other two inclined surfaces 23 of the tool member 20 are pressed by the inclined surfaces 31 of the fixed guide members 30. Thus, the tool member 20 is positioned and mounted to the tool attachment part 12.

As seen from the above, the bonding tool 1 is comprised of two elements: the tool attachment part 12 and the tool member 20. Accordingly, tool members in which only the shape of the tool pressing contact section differs are prepared in conformity to the various types of products to be handled. In other words, the shank member 10, fixed guide members 30 and detachable guide members 40 are common to all of the bonding tools, and only the tool member 20, which is small, is prepared so as to suit the different types of products involved. Accordingly, the amount of storage space required can be small, and the cost of the bonding tool 1 can be reduced.

In cases where the tool member 20 is to be replaced due to a change in the type of product to be handled, or in cases where the tool member 20 is to be cleaned, the attachment bolt 51 on, for example, the side surface 15C of the tool attachment part 12 is loosened, the attachment bolt 51 on the side surface 15D is removed, and one of the detachable guide members 40 is removed. Then, the tool member 20 is removed from the side of the side surface 15D.

Next, in the same manner as described above, another tool member 20 or the cleaned tool member 20 is inserted between the two fixed guide members 30 and one detachable guide member 40 along the undersurface 14 of the tool attachment part 12 from the side surface 15D. The bolt hole 44 of the corresponding detachable guide member 40 is aligned with the screw aperture 16D of the side surface 15D of the tool attachment part 12, and the detachable guide member 40 is fastened to the tool attachment part 12 by the attachment bolt 51. In addition, the attachment bolt 51 on the side of the side surface 15C is tightened so that the corresponding detachable guide member 40 is fastened in place.

As seen from the above, in cases where the tool member 20 is re-attached after being removed for cleaning, two of the inclined surfaces 23 of the tool member 20 are pressed by the inclined surfaces 41 of the two detachable guide members 40, while the other two inclined surfaces 23 of the tool member 20 are pressed by the inclined surfaces 31 of the fixed guide members 30, so that the tool member 20 is positioned and mounted to the tool attachment part 12. In other words, two of the inclined surfaces 23 of the tool member 20 are securely positioned by the inclined surfaces 31 of the two fixed guide members 30; accordingly, attachment/detachment of the tool member can be performed easily and rapidly.

When it is necessary to use a tool member in which the shape of the pressing contact section is the same but is rotated by 90 degrees, the following replacement operation is performed:

First, in the same manner as described above, the attachment bolt 51 on, for example, the side surface 15C of the tool attachment part 12 is loosened. The attachment bolt 51 on the side surface 15D is removed, and one of the detachable guide members 40 is removed.

Then, the tool member 20 is removed from the side of the side surface 15D and is rotated by 90 degrees, after which the tool member 20 is inserted between the two fixed guide members 30 and one detachable guide member 40 along the undersurface of the tool attachment part 12 from the side of the side surface 15D.

Next, the bolt hole 44 of the corresponding detachable guide member 40 is aligned with the screw aperture 16D of the side surface 15D of the tool attachment part 12, and the detachable guide member 40 is fastened to the tool attachment part 12 by the attachment bolt 51. In addition, the attachment bolt 51 on the side surface 15C is tightened so that the corresponding detachable guide member 40 is fastened in place.

As seen from the above, when only the orientation of the pressing contact section 22 is different, the same tool member 20 can be used with the orientation of attachment being changed. Accordingly, the number of different types of tool members required can be reduced.

As described above in detail, the present invention relates to a bonding tool in which a tool member is detachably mounted to the lower end of the tool attachment part of a shank member, and the feature of the invention is that the side surfaces of the side surfaces of the tool holding section of the tool member are formed as four-sided inclined surfaces, two fixed guide members on which the inclined surfaces that position two adjacent inclined surfaces of the tool member are formed are fastened to the tool attachment part of the shank member, and two detachable guide members on which inclined surfaces that push against the remaining two inclined surfaces of the tool member are formed are detachably fastened to the tool attachment part of the shank member.

Accordingly, the tool member is easily mounted on and dismounted from the attachment part of the shank member. In other words, the bonding tool of the present invention has a good reproducibility of attachment of the tool member. In addition, the time required for mounting and dismounting the tool member can be short, and costs are low. Moreover, the number of different types of tool members required can be reduced.

It is claimed:

1. A bonding tool in which a tool member is detachably mounted on a lower end of a tool attachment part of a shank member, wherein side surfaces of a tool holding section of said tool member are formed as four-sided inclined surfaces, two fixed guide means on which inclined surfaces that position two adjacent inclined surfaces of said tool member are formed are fastened to said tool attachment part of said shank member, and two detachable guide means on which inclined surfaces that push against remaining two inclined surfaces of said tool member are formed are detachably fastened to said tool attachment part of said shank member so that said tool member is pushed against said fixed guide means.

2. A bonding tool for bonding semiconductor pellets in a bonding apparatus, said bonding tool comprising:

a shank member having a tool attachment part;

a plurality of guide means detachably fastened by fastening means to an end surface of said tool attachment part, each of said plurality of guide means having an engagement surface; and a tool member having a pressing section which presses a workpiece, said tool member being provided with a plurality of engagement surfaces which engage with said engagement surfaces of said plurality of guide means so that said tool member is detachably mounted to said end surface of said tool attachment part by said plurality of guide means when said engagement surfaces of said guide means and said engagement surfaces of said tool member are brought to engage and said plurality of guide means are fastened by said fastening means to said end surface.

* * * * *